[72] Inventors Ronald C. Scheerer Baltimore; Seymour J. Rogal, New Carrollton, both of Md.

[21] Appl. No. 43,720

[22] Filed June 5, 1970

[45] Patented Nov. 23, 1971

[73] Assignee Westinghouse Electric Corporation Pittsburgh, Pa.

[54] PRECISION ASTABLE MULTIVIBRATOR
11 Claims, 4 Drawing Figs.

[52] U.S. Cl. .......................................................... 331/113, 331/111

[51] Int. Cl. .......................................................... H03k 3/282

[50] Field of Search .......................................................... 331/113, 111, 143, 144, 145

*Primary Examiner*—John Kominski
*Attorneys*—F. H. Henson, E. P. Klipfel and J. L. Wiegreffe ABSTRACT: A free-running multivibrator employing semiconductive devices wherein the accuracy of the frequency output is relatively insensitive to variations in semiconductor characteristics. The multivibrator is comprised of a pair of differential amplifiers, one of which includes a matched pair of field effect transistors which are alternately rendered conductive and nonconductive by the charge and discharge of a single capacitor.

WITNESSES:
Bernard R. Giegucz
Leon M. Garman

INVENTORS
Ronald C. Scheerer &
Seymour J. Rogal.
BY Ernest P. Klipfel
ATTORNEY

PRECISION ASTABLE MULTIVIBRATOR

BACKGROUND OF THE INVENTION

The present invention is related to the class of relaxation-type oscillators called multivibrators. Multivibrators are usually composed of a pair of cross-coupled amplifying devices which may be, for example, electronic tubes or transistors. A free-running or astable multivibrator is one in which no trigger is required to initiate the switching of the circuit from one state of operation to the other. The use of semiconductor devices, such as transistors in such circuits, offers several advantages over electron tubes, mainly compactness, lower heat dissipation and lower power requirements.

Transistor multivibrator circuits are well known to those skilled in the art and the operation of these circuits is well documented in practically every current textbook on the subject of electronic and semiconductor circuitry. Present state-of-the-art circuits for generating a free-running output, however, generally suffer from the basic limitation of not being able to produce a precision stable output frequency. Where transistors are utilized the frequency, first of all, is modified by transistor loading which is a function of not only transistor type but also of temperature. Moreover, maximum timing resistor values are determined by transistor characteristics necessitating the use of extremely large capacitors for low frequencies. Maximum collector swing is limited by the reverse base to emitter voltage rating of the transistor and necessitates a relatively larger RC time constant for the same given frequency. Because of these small voltage swings, the crossover slope at the point of switching is gradual, thereby resulting in excessive jitter of the output. The actual crossover voltage is determined by transistor parameters which inherently vary with temperature. This also leads to frequency instability.

Other means of generating a free-running output includes such circuits as the Wien bridge oscillator, the phase shift oscillator and the L–C controlled oscillator. Circuits of these types of oscillators including semiconductor devices such as transistors are also well known to those skilled in the art. However, these circuits also suffer from most of the disadvantages outlined above and are not acceptable for use where a precision stable output is required.

SUMMARY

The present invention is directed to a precision astable multivibrator circuit including a pair of matched field effect transistors coupled together in a first differential amplifier configuration, a second pair of transistors coupled together in a second differential amplifier configuration being respectively coupled to the output of the pair of field effect transistors, and an output transistor coupled to the second differential amplifier configuration. A single capacitor is coupled between the input of one of the field effect transistors and a point of reference potential. A resistor is coupled from the capacitor to the output electrode of the output transistor to provide a single charge and discharge RC time constant. Additionally, first precision resistor means is coupled from the output electrode of the output transistor to the input of the other field effect transistor having a reference potential applied thereto by means of a voltage divider coupled across a first and a second point of reference potential and including second precision resistor means.

DESCRIPTION OF THE PREFERRED EMBODIMENT

Figure 1:
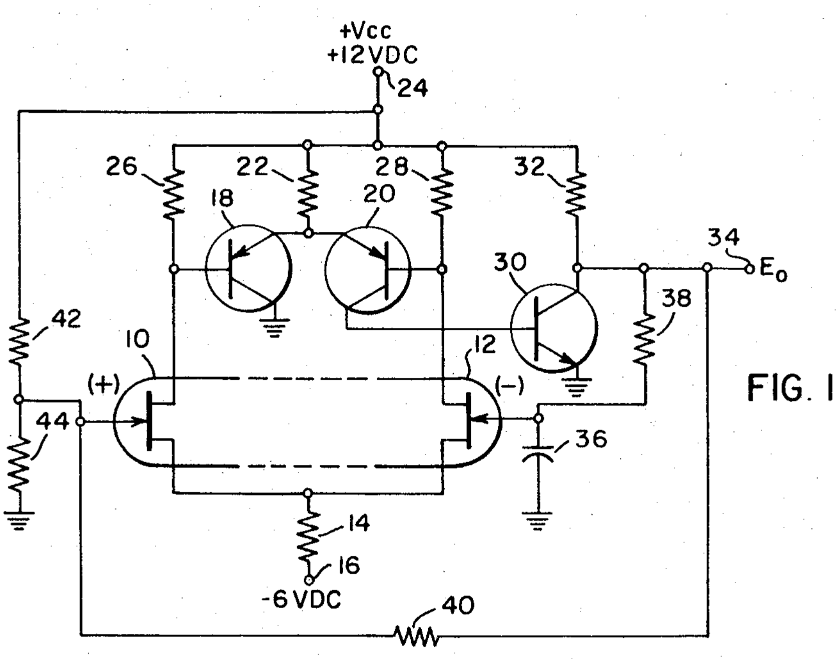
FIG. 1 is an electronic schematic diagram of the preferred embodiment of the subject invention.

Referring now to FIG. 1, there is disclosed in schematic form first, a matched pair of field effect transistors 10 and 12 coupled together in a differential amplifier configuration wherein the respective source electrodes are directly connected to a common resistor 14 which is coupled to a source of negative power supply potential (−6 VDC) applied to terminal 16 from a source, not shown. Secondly, the output or drain electrode of the field effect transistors 10 and 12, hereinafter referred to singly as FET 10 and 12, are respectively connected to the input or base electrode of a second pair of transistors 18 and 20 which are also connected together in a differential amplifier configuration due to the fact that their respective emitter electrodes are directly connected to a common resistor 22. The opposite end of resistor 22 is coupled to a source of positive power supply potential (VCC=+12 VDC) applied to terminal 24 from a source not shown. Drain resistors 26 and 28 are also respectively coupled to the base electrodes of transistors 18 and 20 from terminal 24. The collector electrode of transistor 18 is returned to a point of common reference potential illustrated as ground while the collector electrode of transistor 20 is directly connected to the base electrode of an output transistor 30 which also has its emitter electrode connected to ground potential. The collector electrode of the output transistor 30 is connected to a collector load resistor 32 which has its opposite end directly connected to the positive supply potential applied to terminal 24. An output signal $E_o$ is adapted to be coupled directly from the collector electrode of transistor 30 by means of the output terminal 34.

A single precision capacitor 36 which is adapted to be alternately charged and discharged in accordance with the operation of the subject circuit has one side thereof directly connected to the gate electrode of FET 12 while the opposite side is returned to ground. A precision resistor 38 is directly connected between the gate electrode of FET 12 and the collector electrode of transistor 30. The combination of capacitor 36 and resistor 38 have respective values the RC time constant of which controls the charge and discharge operation of the capacitor 36. Moreover, the resistance value of the resistor 38 is selected to be much greater than the value of the collector resistor 32. Three additional precision resistors 40, 42 and 44 are included for selecting the operating voltage levels and determine the region of the exponential charge and discharge curve that the capacitor 36 operates.

More particularly, resistor 40 is directly connected from the collector electrode of transistor 30 which is common to one side of resistor 38 to the gate electrode of FET 10. Resistors 42 and 44 are connected in series between the positive supply potential applied to terminal 24 and ground. The common connection between resistors 42 and 44 is directly connected to the gate electrode of FET 10.

The operation of the circuit comprising the subject invention is dependent on the exponential charging and discharging of capacitor 36 in combination with resistor 38 between two voltage levels $E_1$ and $E_2$ which are determined by the resistors 40, 42 and 44. Assuming for purposes of explanation that there is no charge on capacitor 36 and that FET 10 is conducting, then FET 12 is nonconductive or in its "off" state. The conductive state of FET 10 also biases transistor 18 into its conductive or "on" state while transistor 20 is held "off." Due to the connection of the collector of transistor 20 to the base of transistor 30, transistor 30 is also in its "off" state. With transistor 30 being cutoff, the collector voltage appearing at terminal 34 will be essentially at the positive supply potential +Vcc. Capacitor 36 will charge exponentially toward the supply potential +Vcc with the time constant of $t=R_{38}\times C_{36}$. When the voltage across capacitor 36 reaches a value slightly more positive than $+E_1$ volts where $$E_1=\frac{Vcc\times R_{44}}{\frac{R_{42}\times R_{40}}{R_{42}+R_{40}}+R_{44}} \qquad (1)$$

the FET 10 will conduct and the FET 12 will be cutoff. With FET 12 being "on," transistors 20 and 30 will also be rendered conductive. Moreover, transistor 30 will be driven into the saturation region of its current-voltage characteristics and the voltage at the collector will be slightly above zero or ground potential being of a value equal to the collector to emitter voltage drop at saturation $V_{ce(sat)}$ of the transistor. With the collector voltage substantially at zero volts, a new voltage $+E_2$ is set up at the gate electrode of FET 10 where $$E_2=\frac{Vcc\times\frac{R_{44}\times R_{40}}{R_{44}+R_{40}}}{\frac{R_{44}\times R_{40}}{R_{44}+R_{40}}+R_{42}}, \quad (2)$$

The capacitor 36 begins to discharge through transistor 30 toward the voltage $V_{ce(sat)}$ exponentially according to the time constant $t=R_{38}\times C_{36}$. When the voltage across capacitor 36 reaches a value slightly less than $+E_2$ volts, the FET 10 will again conduct at which time the FET 12 will be cutoff including transistors 20 and 30 whereupon the collector voltage of transistor 30 again returns to the positive supply potential $+Vcc$. This operation continually repeats itself providing a free running output $E_o$ alternately switching from the positive supply potential $+Vcc$ (+12 VDC) and substantially ground potential in a step function thereby providing a square wave output at terminal 34. As will be more fully described in reference to FIG. 4, the periods $t_1$ and $t_2$ may be made equal to generate a square wave output or a nonsymmetrical square wave can be obtained when $t_1$ is unequal to $t_2$.

Figure 2:
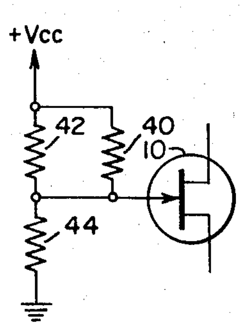
FIGS. 2 and 3 are illustrative of the resultant precision resistor means connection occurring during alternate half cycles of operation of the preferred embodiment.
Figure 3:
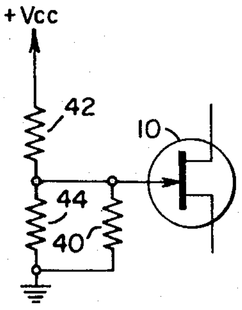

The voltage levels $E_1$ and $E_2$ can readily be seen to be dependent upon the resistive values of resistors 40, 42 and 44 by referring to FIGS. 2 and 3. FIG. 2, for example, illustrates the series-parallel resistor combination established between resistors 40, 42 and 44 during the time that transistor 30 is cutoff, i.e. when FET 12 is nonconductive. What is shown by FIG. 2 is resistor 40 and 42 being connected in parallel and coupled to the positive supply potential $+Vcc$. In actuality, the collector load resistor 32 is inserted in series with resistor 40, however, the value of resistor 40 is selected to be much greater than the resistor 32 and the latter therefore becomes negligible.

When transistor 30 becomes conductive during the other half cycle of operation, output terminal 34 is essentially at ground potential. Therefore, resistor 40 is returned to ground as shown by FIG. 3 thus giving rise to the voltage $E_2$ as shown in equation (2) above.

Figure 4:
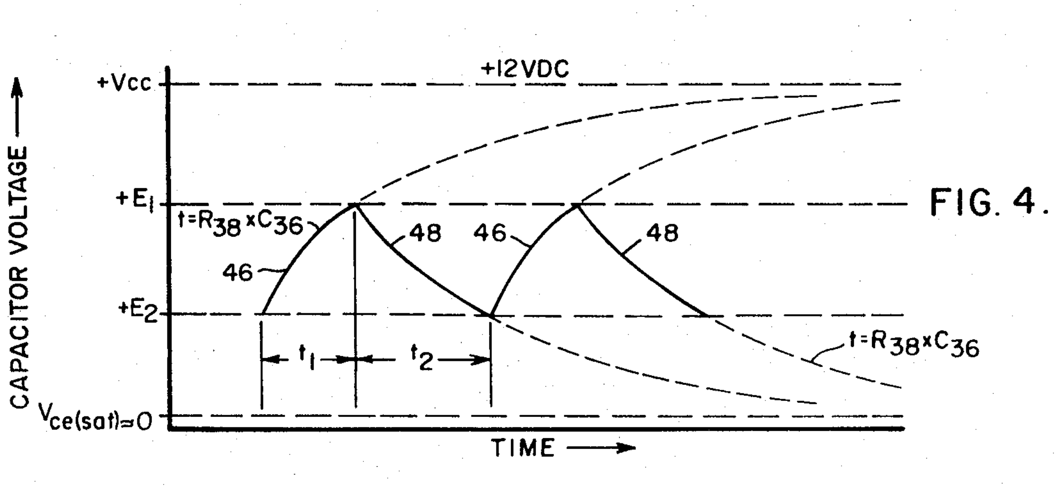
FIG. 4 is a diagram illustrative of the voltage change across the single capacitor during a complete cycle of operation of the preferred embodiment shown in FIG. 1.

The operation of the embodiment shown in FIG. 1 is further illustrated by reference to FIG. 4 which discloses the charging and discharging curves 46 and 48, respectively, of the capacitor 36 between the voltage levels $E_1$ and $E_2$. This gives rise to half cycle time periods $t_1$ and $t_2$ which can be selectively made to be symmetrical or nonsymmetrical depending upon the values chosen for resistors 40, 42 and 44 even though the RC time constant of resistor 38 and capacitor 36 is the same. Furthermore, the voltage levels $E_1$ and $E_2$ can be expressed by the following equations:

$$E_1=E_2+(V_{cc}-E_2)(1-e^{t_1/t}) \quad (3)$$

$$E_2=V_{ce(sat)}+[E_1-V_{ce(sat)}](e^{-t_2/t}) \quad (4)$$

It should be observed that a multivibrator embodying the concept disclosed by the subject invention provides a very accurate output signal. Moreover, the output is a constant amplitude variable duty cycle square wave. It exhibits a relatively low output impedance while the matched FETs present a high input impedance which allows the use of large timing resistors and small timing capacitors which makes it adaptable for low frequency operation. Lastly, the subject circuit has essentially zero change in switching level with respect to temperature because of the matched pair of field effect transistors.

While the present invention has been described with respect to a specific embodiment, it is not meant to be considered in a limiting sense inasmuch as all equivalents, alterations, and modifications coming within the spirit and scope of the invention have herein meant to be included.

We claim as our invention:

1. A multivibrator circuit, powered by a supply potential, which is adapted to provide an output signal which varies in amplitude substantially between the value of the supply potential and a point of reference potential, comprising in combination:

a first pair of amplifying devices coupled together in a first differential amplifier circuit configuration including a common impedance and additionally including first and second input means, and first and second output means;

a second pair of amplifying devices coupled together in a second differential amplifier circuit configuration including a common impedance and additionally including third and fourth input means, and third and fourth output means;

circuit means coupling said first and second output means respectively to said third and fourth input means;

an output amplifying device having fifth input and output means;

circuit means coupling said third output means to said point of reference potential and said fourth output means to said fifth input means of said output amplifying device;

a source of variable reference potential coupled to said first input means being adapted to change from one selected potential level to another in response to the conductive state of said output amplifying device;

capacitor means coupled from said second input means to said point of reference potential;

and resistor means coupled from said second input means to said fifth output means, said resistor and capacitor means providing an RC time constant for said capacitor means whereby said capacitor alternately charges and discharges between said one and another selected potential level in accordance with the alternate conduction of said first pair of amplifying devices.

2. The invention as defined by claim 1 wherein said source of variable reference potential comprises other resistor means connected between said source of supply potential and said point of reference potential including means for connection to said first input means, and still another resistor means coupled from said fifth output means of said output amplifying device to said first input means.

3. The invention as defined by claim 2 wherein said other resistor means comprises at least a first and a second resistor connected in series with the common connection therebetween being connected to said first input means, and said another resistor comprises at least a third resistor.

4. The invention as defined by claim 1 wherein said first pair of amplifying devices comprises a pair of transistors.

5. The invention as defined by claim 4 wherein said pair of transistors comprises a pair of matched transistors.

6. The invention as defined by claim 5 wherein said pair of matched transistors comprises a pair of matched field effect transistors.

7. The invention as defined by claim 6 and additionally wherein said second pair of amplifying devices and said output amplifying device recited in claim 1 are comprised of transistors.

8. The invention as defined by claim 7 wherein said second pair of transistors are comprised of transistors having the same conductivity and wherein said output transistor is of opposite conductivity.

9. The invention as defined by claim 6 wherein said matched pair of field effect transistors respectively include a gate, a drain and a source electrode and wherein said first and second input means comprises the gate electrode, the first and second output means comprises the drain electrode and whereby said source electrodes are directly connected to said common impedance.

10. The invention as defined by claim 9 wherein said second pair of transistors recited in claim 7 includes a base, an emitter, and a collector and wherein said third and fourth input means comprises the respective bases, said third and fourth output means comprises the respective collectors and wherein said common impedance comprises an emitter impedance directly connected from said emitters to said source of supply potential.

11. The invention as defined by claim 10 and wherein said output transistor as recited in claim 7 includes a base, a collector and an emitter electrode and wherein said fifth input means comprises the base and said fifth output means comprises the collector.

* * * * *